United States Patent
Farooqi et al.

(10) Patent No.: US 9,537,469 B2
(45) Date of Patent: Jan. 3, 2017

(54) CMOS LEVEL SHIFTER WITH REDUCED HIGH VOLTAGE TRANSISTOR COUNT

(71) Applicants: TREEHOUSE DESIGN, INC., Colorado Springs, CO (US); Neaz Farooqi, Colorado Springs, CO (US); Glenn E. Noufer, Colorado Springs, CO (US); Randall L. Sandusky, Divide, CO (US)

(72) Inventors: Neaz Farooqi, Colorado Springs, CO (US); Glenn E. Noufer, Manitou Springs, CO (US); Randall L. Sandusky, Divide, CO (US)

(73) Assignee: Treehouse Design, Inc., Colorado Springs, CO (US)

( * ) Notice: Subject to any disclaimer, the term of this patent is extended or adjusted under 35 U.S.C. 154(b) by 0 days.

(21) Appl. No.: 15/034,814

(22) PCT Filed: Nov. 6, 2014

(86) PCT No.: PCT/US2014/064358
§ 371 (c)(1),
(2) Date: May 5, 2016

(87) PCT Pub. No.: WO2015/069903
PCT Pub. Date: May 14, 2015

(65) Prior Publication Data
US 2016/0294370 A1    Oct. 6, 2016

Related U.S. Application Data

(60) Provisional application No. 61/900,726, filed on Nov. 6, 2013.

(51) Int. Cl.
*H03K 3/00* (2006.01)
*H03K 3/012* (2006.01)
*H03K 19/0185* (2006.01)

(52) U.S. Cl.
CPC ...... *H03K 3/012* (2013.01); *H03K 19/018528* (2013.01)

(58) Field of Classification Search
None
See application file for complete search history.

(56) References Cited

U.S. PATENT DOCUMENTS

| 6,043,698 A   | 3/2000 | Hill    |                    |
| 7,511,553 B2* | 3/2009 | Nuebling | ......... H03K 3/356104 |
|               |        |         | 327/333            |

(Continued)

OTHER PUBLICATIONS

PCT/US2014/064358 International Search Report & Written Opinion mailed Mar. 3, 2015, 11 pages.

*Primary Examiner* — Long Nguyen
(74) *Attorney, Agent, or Firm* — Lathrop & Gage LLP

(57) ABSTRACT

A digital level shifter adapted to shift an input signal from switching in a low voltage range, to an output switching in a high voltage range has a glitch generator configured to generate pulses at rising and falling transitions of the input signal. Glitch generator output triggers a multiple-level current source to a high current mode, operating in a low current mode at other times. The current source feeds a differential pair of high voltage transistors with a first transistor of the pair having a gate coupled to the input signal and a second transistor of the pair having a gate coupled to a complement of the input signal. An active load and buffer circuit receives current from the differential pair and drives the output accordingly.

8 Claims, 8 Drawing Sheets

(56) References Cited

U.S. PATENT DOCUMENTS

| | | |
|---|---|---|
| 7,629,830 B1 | 12/2009 | Rubin |
| 7,683,668 B1 | 3/2010 | Thakur et al. |
| 8,766,696 B2 * | 7/2014 | Gazit ............... H03K 19/01852 |
| | | 327/333 |
| 2005/0134311 A1 * | 6/2005 | Lin ........................ H03K 3/012 |
| | | 326/68 |
| 2008/0068043 A1 | 3/2008 | Chiu |
| 2010/0123505 A1 | 5/2010 | Chou et al. |
| 2012/0049887 A1 | 3/2012 | Sood et al. |
| 2012/0146988 A1 | 6/2012 | Tsuchi |
| 2012/0299631 A1 | 11/2012 | Duby et al. |
| 2013/0154713 A1 * | 6/2013 | Wang ............... H03K 3/356113 |
| | | 327/333 |
| 2013/0207704 A1 | 8/2013 | Tseng et al. |

* cited by examiner

CMOS LEVEL SHIFTER WITH REDUCED HIGH VOLTAGE TRANSISTOR COUNT

CLAIM TO PRIORITY

The present application claims priority to U.S. Provisional Patent Application 61/900,726 filed 6 Nov. 2013, which is incorporated herein by reference.

BACKGROUND

It is often necessary to shift the voltage range of a signal from a low voltage range, such as a logic level of 0 to 1.1 volts, as often used in the core of processor integrated circuits, or 0 to 3.3 volts, as often used in the periphery of processor integrated circuits, to a higher voltage range. For example, a higher voltage range of 0 to 5 volts is commonly used in digital integrated circuits and these circuits may have low voltage cores. Mixed-signal integrated circuits, such as an integrated circuit for use in power handling and display driving circuitry, often must handle high voltages while often requiring considerable low voltage logic circuitry. Examples of mixed-signal circuits include microprocessor-controlled buck-type MPPT charge-controllers used to regulate solar panels, where charging a 24-volt battery may require switching peak 40-volt panel outputs; and serial-network interfaced, reversible, door-mounted, window-or-lock motor controller circuits in automobiles may also be subjected to surge voltages rising well above nominal 12-volt motor supply voltages. These are just examples, many thousands of applications exist for integrated circuits that control, switch, or sense voltages higher than their logic core voltages throughout the electronics industry; even where high currents are handled in separate discrete transistors it can be desirable for controlling integrated circuits to provide high-voltage output signals instead of requiring predrivers built of discrete components.

Switching or sensing high voltages typically requires the use of one or more high-voltage transistors in a logic level-shifter circuit integrated on the integrated circuit.

High voltage transistors integrated on conventional CMOS processes often require greater area than required for low voltage transistors on the same process. This is partly a consequence of greater source-drain channel-lengths being required at diffusions to avoid source-drain punchthrough at high voltage, relative to channel lengths required for low voltage transistors. It is also a consequence of space required for process and layout techniques required to overcome other effects including channel formation under interconnect metallization. Additional space may also be required for guardrings and similar structures intended to prevent latchup.

Gate-to-source voltage (VGS) may be limited to a maximum ($VGS_{max}$), a process-dependent value between 5 v and 20 v in some CMOS integrated-circuit processes, because exceeding this value could cause irreversible breakdown of thin gate oxides as well as punchthrough currents. Limited $VGS_{max}$ restricts circuitry design in level shifters. Some process techniques exist for providing high-voltage transistors with greater $VGS_{max}$, although use of these techniques comes at a cost of increased area and decreased source-drain current per unit area, often requiring greater die area for such high-voltage transistors.

SUMMARY

In an embodiment, a digital level shifter adapted to shift an input signal from switching in a low voltage range, to an output switching in a high voltage range has a glitch generator configured to generate pulses at rising and falling transitions of the input signal. Glitch generator output triggers a multiple-level current source to a high current mode, operating in a low current mode at other times. The current source feeds a differential pair of high voltage transistors with a first transistor of the pair having a gate coupled to the input signal and a second transistor of the pair having a gate coupled to a complement of the input signal. An active load and buffer circuit receives current from the differential pair and drives the output accordingly.

In an embodiment, a method of shifting an input signal from a switching range at a low level to a high level includes providing a low level current to a differential pair of high voltage transistors, at least one transistor of the differential pair being coupled to the input signal. Changes of the input signal are detected, and, upon detecting changes of the input signal, a high level current is provided to the differential pair of high voltage transistors. The method concludes with detecting a differential current from drains of the high voltage transistors, and deriving an output signal therefrom.

In another embodiment, a low-voltage to high-voltage level shifter has a current source coupled to provide current to a source of a first high voltage transistor, and to a source of a second high voltage transistor. A low voltage input signal is coupled to a gate of the first high voltage transistor, and a complementary low voltage input signal is coupled to a gate of the second high voltage transistor as these act as a differential pair. The drain of the first high voltage transistor is coupled to a drain of a first cross-coupled low-voltage transistor, the drain of the second high voltage transistor being coupled to a drain of a second cross-coupled low-voltage transistor. The cross coupled transistors are cross coupled with the gate of the first cross-coupled low-voltage transistor is coupled to the drain of the second high voltage transistor, and the gate of the second cross-coupled transistor is coupled to the drain of the first high voltage transistor. Transistors, both high and low and high voltage, are selected from the group consisting of N-channel and P-channel MOS transistors. The current source is adapted to provide a first current to the sources of the high voltage transistors when the low voltage input signal is stable and to provide a second current greater than the first current when the low voltage input signal changes.

DETAILED DESCRIPTION OF THE EMBODIMENTS

Figure 1:
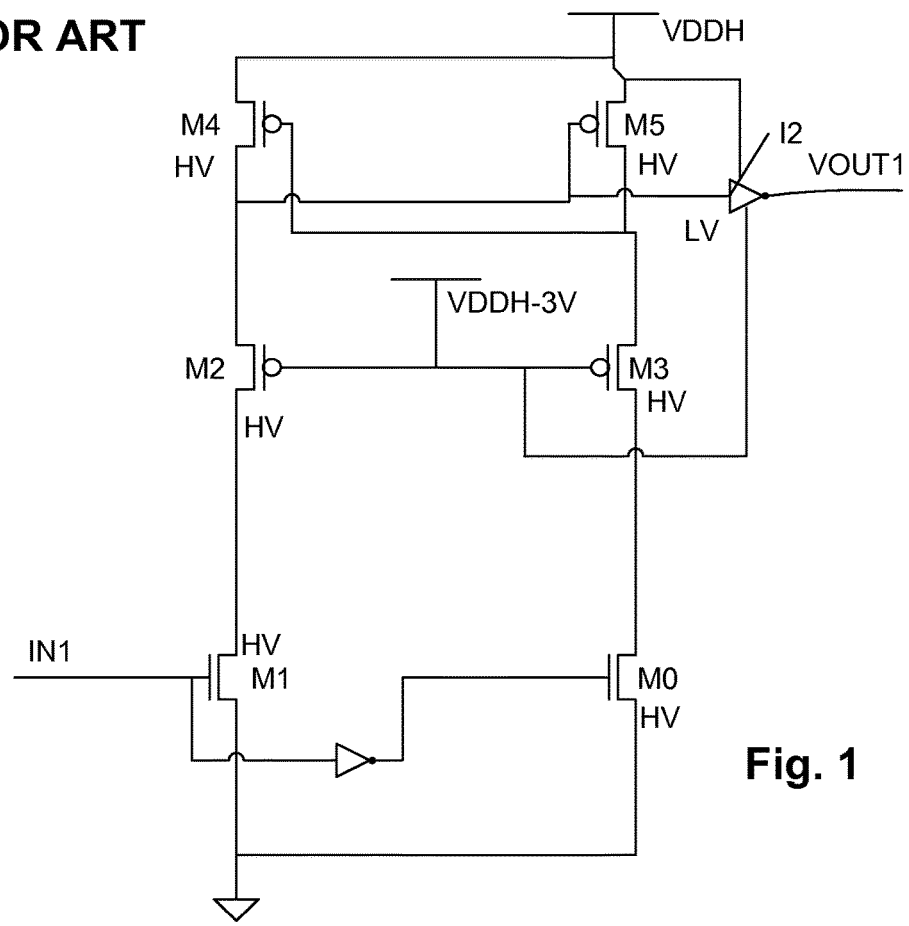
FIG. 1 is a schematic diagram of a prior art level shifter.

FIG. 1 illustrates a prior art level shifter. Transistor M1 receives a low voltage incoming voltage IN1, and transistor M0 a complementary input. In this device, transistors M2, M3 work as cascode transistors and set the lower rail for the outgoing level shifted voltage. Transistors M4, M5 work as a cross coupled positive feedback latch to gain the signal so that a static CMOS inverter I2 can be properly driven to provide an output VOUT1. A high voltage power supply VDDH provides power to the cross-coupled latch formed by M4 and M5, as well as output inverter I2. The output of inverter I2, in a particular example, swings from VDDH to VDDH-3 v. As described earlier even though this level shifter is fairly simple, all 6 transistors M0, M1, M2, M3, M4, and M5 are high voltage devices consuming a large amount of die area.

Conventional static CMOS level shifters, as illustrated in FIG. 1, work well when level shifting 1.2 v or 3.3 v static CMOS signals up to medium voltage signals, level shifts up to 32 v may be achieved by cascading two static CMOS level shifters. Their dc power consumption is zero, and their area requirements are modest. However, if an application requires 3.3 v static CMOS signals to be level shifted to voltage levels beyond +/−30 v, then the conventional static CMOS level shifters of FIG. 1 may consume an impractical amount of area because of the large number of high-voltage transistors used. This area-constraint problem is compounded if multiple level shifters are needed on the same die. It can therefore be desirable to implement level shifter and high voltage driver circuitry using as few high-voltage transistors as practical, even if a greater number of low-voltage transistors are required than with traditional level-shifter designs.

Analog comparator-based level shifters have also been used, these typically require a dc tail current source for a differential pair that dissipates large amounts of dc power, such designs are impractical to implement for low power applications.

Figure 2:
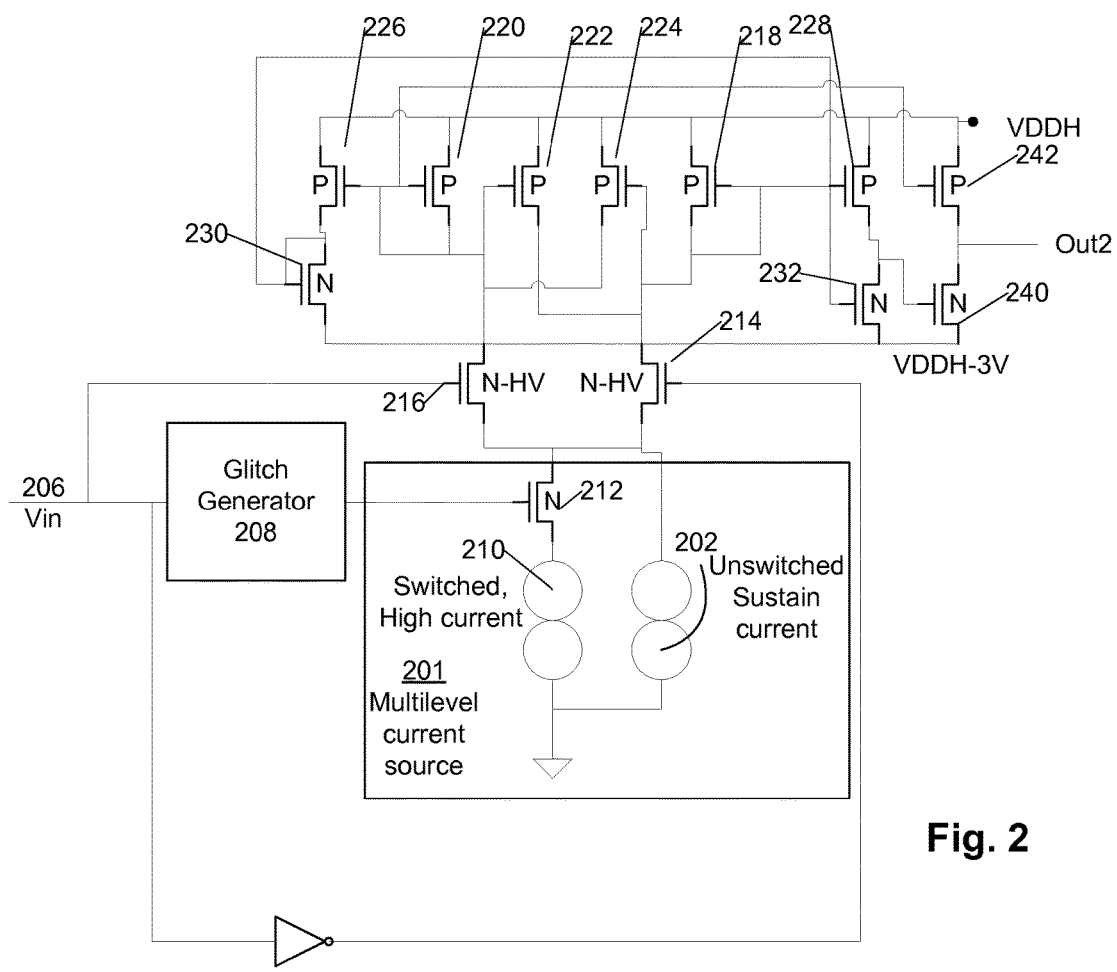
FIG. 2 is a diagram of a new pulsed-current differential level-shifter.

The proposed device addresses both problems. The design, as illustrated in FIG. 2 uses an analog comparator based level shifter with an electronically-switchable multi-level current source 201. In a particular embodiment, multilevel current source 201 is a two-level current source including a low-current dc continuous tail current unswitched sustain-current source 202, in a particular embodiment of 15 nanoamperes, to overcome any voltage droop due to junction leakage. In order to meet propagation delay requirements, a glitch generator 208 detects changes in an input signal 206; when changes in input 206 are detected, a high current source 210 of multilevel current source 201 is enabled by switch transistor 212, and in a particular embodiment providing a high current of 15 uA, in parallel to the low current tail current source 202. In a particular embodiment, high current source 210 is enabled only during a 50 ns window after each change to the incoming signal 206. In alternative embodiments, alternative ways of switching current levels are incorporated into multilevel current source, for example switch transistor 212 may be on either the drain or the source of a current mirror transistor forming current source 210.

Glitch generator, unswitched sustain-current source, switched current source, and associated circuitry are powered by, and signals switch between, a low voltage power VDDL and a voltage VDDL less an offset, the offset being a low voltage between 2 and 5 volts. In a particular embodiment as illustrated, VDDL less the offset is a ground voltage.

When no changes to the input 206 are detected, glitch generator 208 keeps the high-current current source off, thereby reducing circuit power consumption. Duty cycling the high-current tail current source 210 during transitions allows us to keep the power dissipation to its minimum, while allowing rapid transitions. Similarly the high tail current source 210 can be increased or decreased by adding/subtracting gate fingers for applications requiring different operating speeds, or dynamically altered by selecting additional current settings when different speeds are required, and the width of enable pulses from glitch generator 208 to current source pass transistor 212 is adjustable by changing to a capacitor in the glitch generator circuit.

The levelshifter uses only two high voltage devices 214, 216 in the differential pair of the comparator. One high voltage device 216 has gate coupled to input 206, the other high voltage device 214 has its gate coupled to a complement of input 206. The voltage swing is kept well below 5 v in most of the design to allow 5 v devices to be used, thus requiring very small area. Low voltage transistors 218, 220 provide an active load for high-voltage devices 214, 216, cooperating with cross-coupled gain-enhancement devices 222, 224 to provide a significant differential signal that also appears at sense transistor pair 226, 228.

The differential signal at sense transistor pair 226, 228 is amplified by an output amplifier as follows: Typically, only one of sense transistor pair 226, 228 conducts at any given moment of time, if sense transistor 226 is conducting its current is mirrored in mirror transistors 230, 232. Pullup current from sense transistor 228 or mirror transistor 232 is combined to drive output buffer transistor 240 on when current flows in high voltage device 214. Similarly, when current flows in high voltage device 216, output buffer transistor 242 is turned on.

Figure 3:
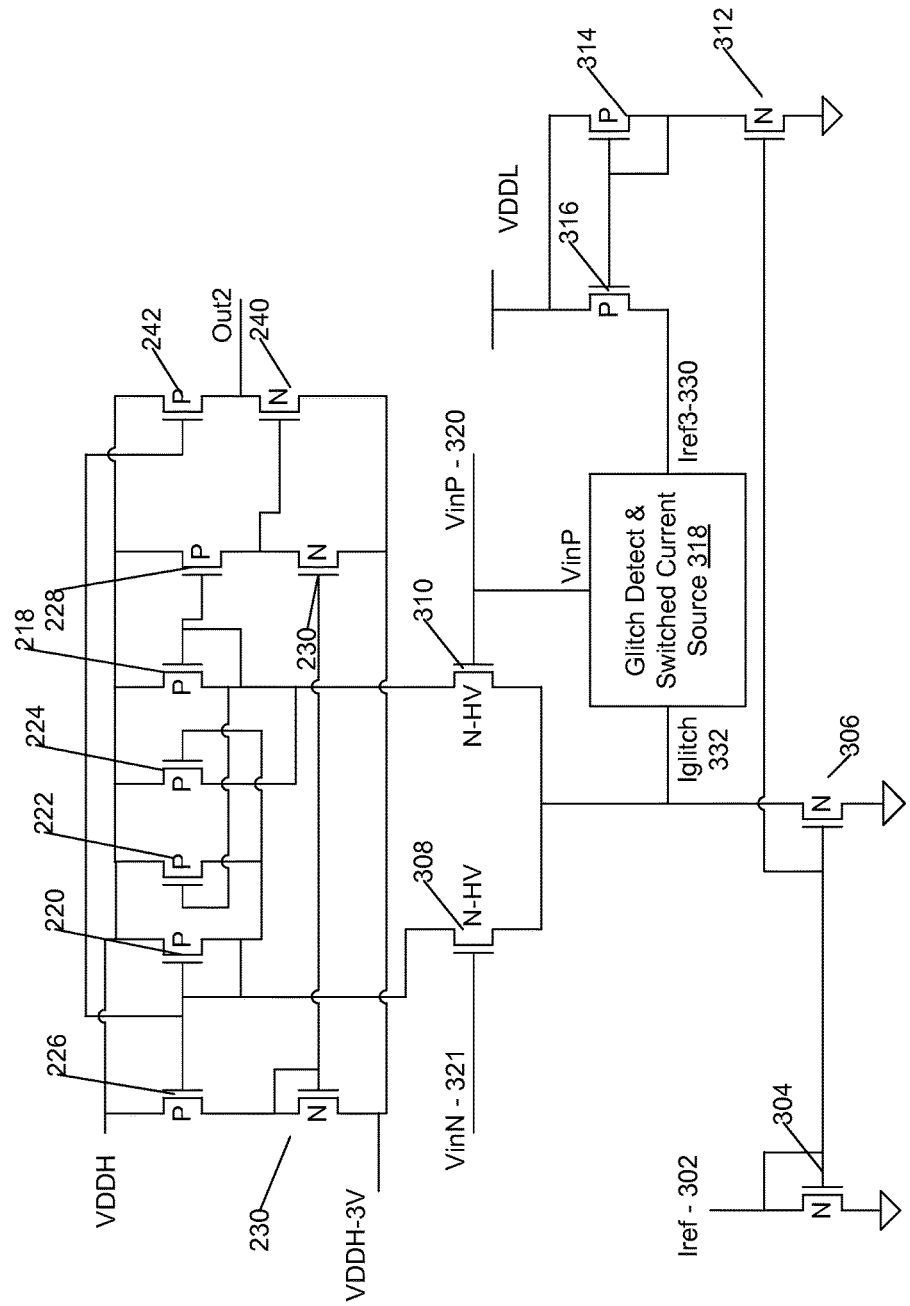
FIG. 3 is a schematic diagram of a new level shifter suitable for shifting the level of logic signals from 3V to N V, where N is a high voltage.

FIG. 3 illustrates an embodiment of the level shifter that can shift an incoming signal from a low voltage range such as 0 to 3 v or 0 to 5 v to a signal near VDDH in more detail.

In this embodiment, the multilevel current source receives a reference current Iref, 302. This reference current is mirrored by mirror transistors 304, 306, to provide a low, static, tail current to a high voltage differential pair formed by transistors 308, 310. Meanwhile reference current 302 is mirrored and amplified by mirror transistors 304, 312, and mirrored and amplified again by mirror transistors 314, 316 to provide an amplified reference current to a glitch detector and switchable current source block 318 that is described in more detail with reference to FIG. 4. In a particular embodiment, this amplified reference current is about eight times greater than reference current Iref 302. A positive input VinP, 320, is fed both to differential pair transistor 310 and to glitch detector and switchable current source block 318, a complement of VINP, 321, is coupled to the other differential pair transistor 308. Similarly, a negative input VinN, 321, is coupled to the other differential pair transistor 308. Differential pair transistors 308, 310 are the only high voltage transistors that receive the static CMOS input.

The active load and cross coupled latch is as described above with reference to FIG. 2, these gain the differential current into an output voltage Out2 that swings between VDDH and VDDH-3 v.

Figure 4:
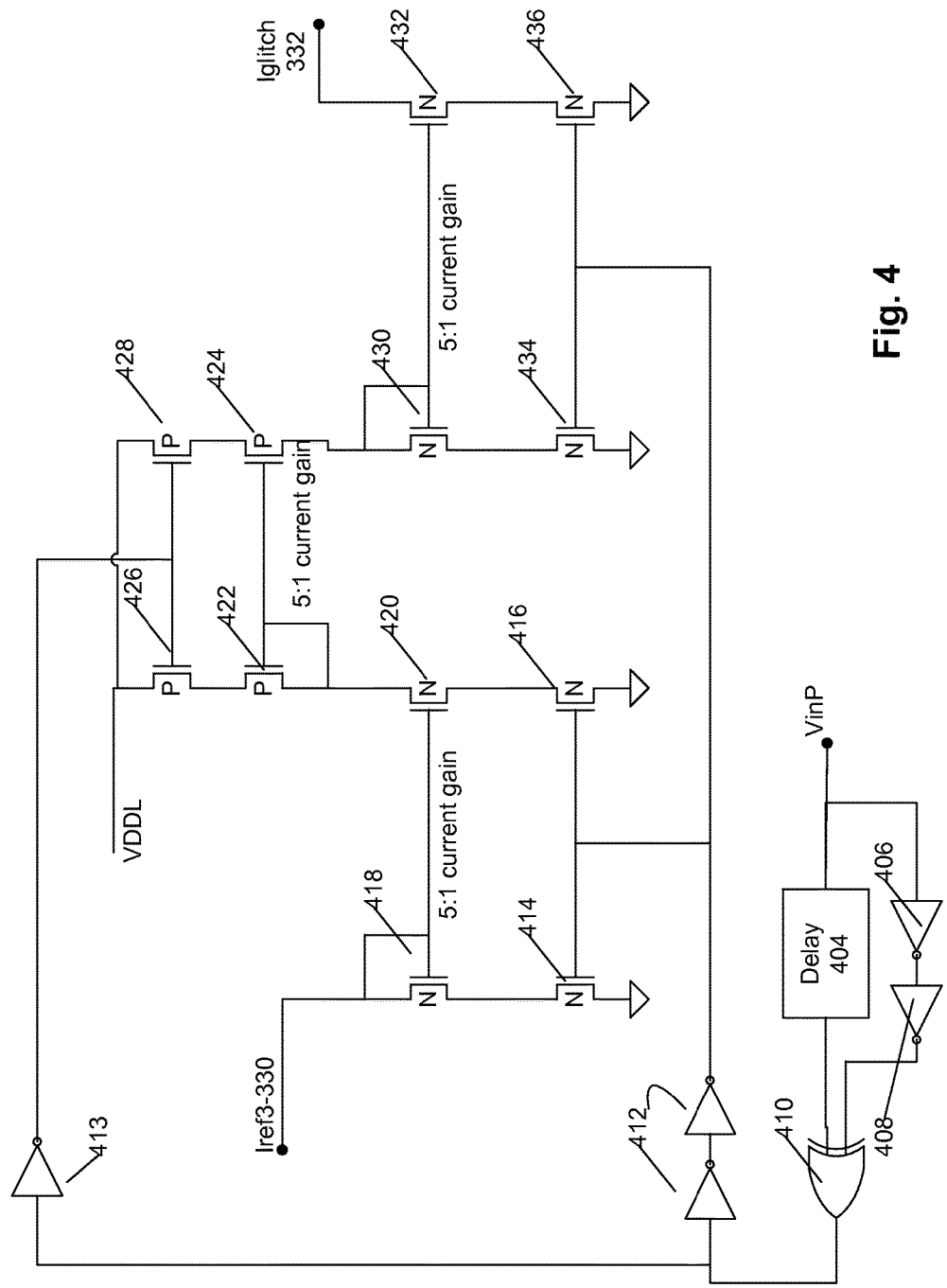
FIG. 4 is a schematic diagram of a current source used in FIG. 3

FIG. 4 illustrates a glitch detector and switchable current source block 318 of FIG. 3 in more detail. VinP, the positive input signal to the level shifter, is provided to a delay circuit 404 and to a buffer formed of inverters 406, 408. Outputs of the delay 404 and buffer are XOR-ed 410 to create a positive pulse, in an embodiment of about 50 nanoseconds width, when the output of the delay does not match the buffer outputs, thus providing a glitch on either positive or negative transitions of signal VinP. The glitch is buffered by inverters 412 to enable transistors 414, 416 coupled to current mirror transistors 418, 420. An active low copy of the glitch is provided by inverter 413. Current mirror transistors 418, 420 mirror and amplify by about 5:1 the reference current Iref3 from FIG. 3. The mirrored and amplified current is again mirrored and amplified about 5:1 by mirror transistors 422, 424. Current in mirror transistors 422, 424 is permitted to flow by enable transistors 426, 428 only during glitches. Similarly, current from mirror transistor 424 is again mirrored and amplified by mirror transistors 430, 432. Again, current in mirror transistors 430, 432 flows only during glitches, as enabled by enable transistors 434, 436, to provide a high current Iglitch 332 that is coupled in parallel with sustain current mirror transistor 306 of FIG. 3. During glitches when the current mirrors of glitch detector and switchable current source block 318 and mirrors 324, 326, 312 are active, the switchable current source block 318 provides, in a particular embodiment, about one hundred twenty-five times amplified reference current Iref3, or about one thousand times the current provided by the low static current provided by source transistor 306. The current gain of the switchable current block, mirror devices 314, 316, and device 312, totals a gain typically greater than one hundred, and may be designed to be in the range 100 to 5000.

Figure 5:
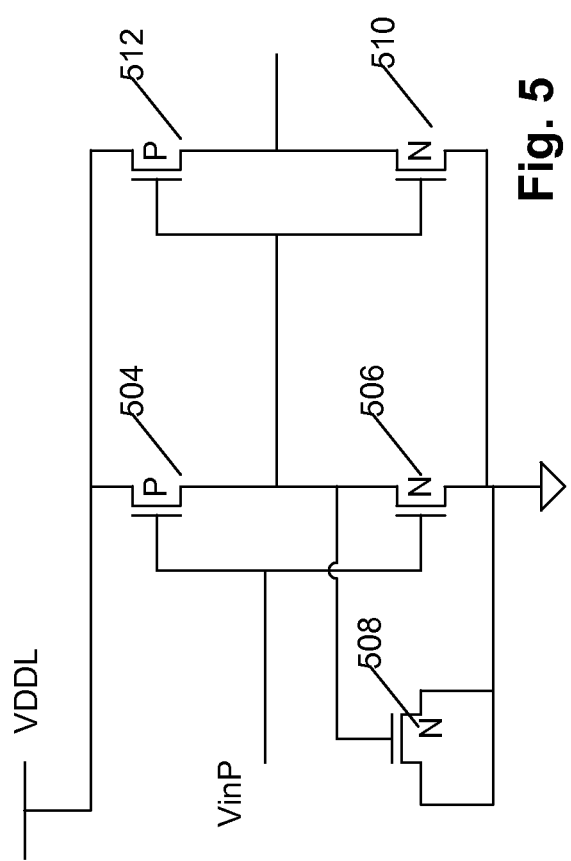
FIG. 5 is a schematic diagram of a delay cell used in FIG. 4, the embodiment of FIG. 3.

In an embodiment, delay 404 is an analog delay circuit having a schematic similar to that of FIG. 5. In this circuit, the input VinP passed to the glitch generator feeds a weak inverter formed of devices 504, 506. The weak inverter has a capacitor 508 attached to its output to slow down transitions. The weak inverter 504, 506 also drives a buffer inverter formed of N and P devices 510, 512

When a high-speed clock is available that has a high switching rate compared to a transition rate of the signal, a digital glitch detector may be used that replaces the analog delay of FIG. 5 ahead of the exclusive-or gate with a shift-register having one or more D-type edge-trigger flip-flops in series, the D-type flip-flops clocked by the high-speed clock. With such a glitch detector, the width of the glitch is determined not by a capacitor size, but by the clock rate and the number of series D-type flip-flops. In other embodiments, such as those where clock periods are far less than desired glitch widths, other forms of digital circuitry such as counters can be used to detect edges and generate appropriate glitch widths for enabling high tail current.

Figure 6:
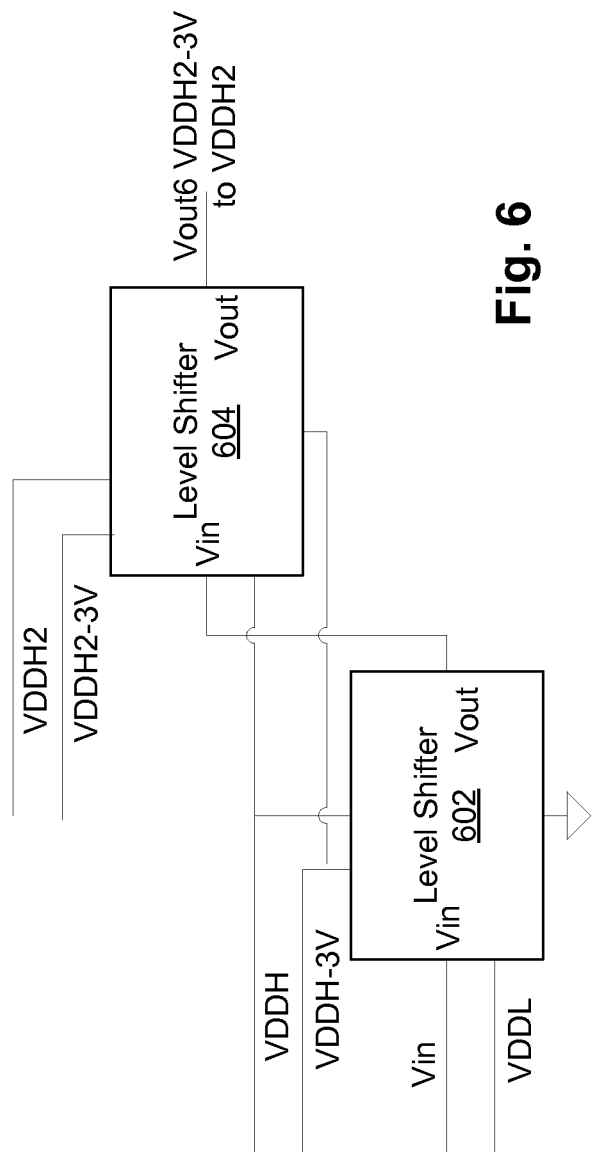
FIG. 6 is a block diagram of a two-stage level shifter

The level shifter may be used in multiple-stage configurations. In a two-stage configuration, as illustrated in FIG. 6, a pair of level shifters 602, 604 using high voltage transistors having a maximum VDS of N volts are used to boost signals from the 0-3V range to a range of (2N-3) to (2N-6).

Figure 7A:
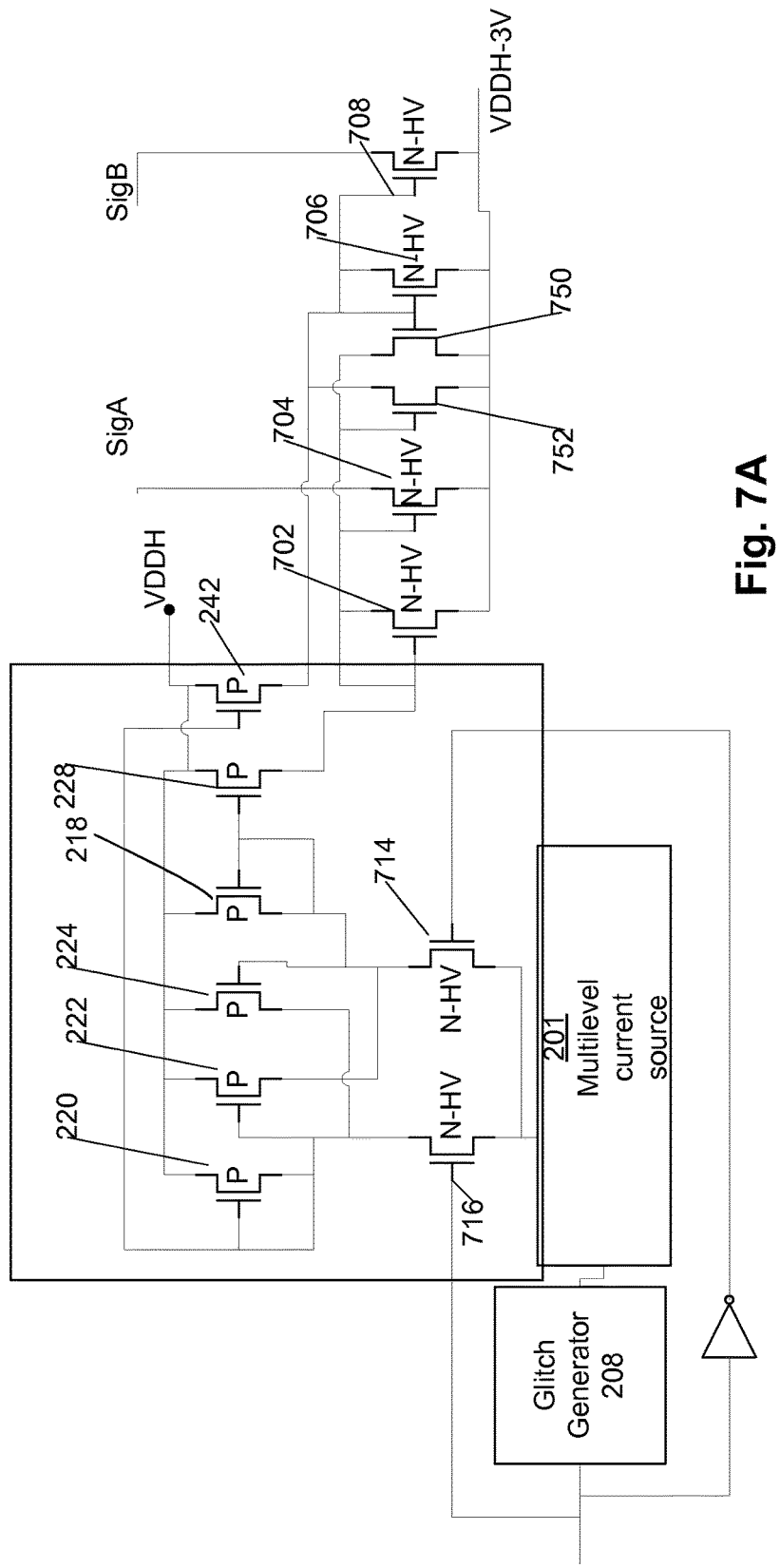
FIGS. 7A and 7B is a schematic diagram of a two-stage level shifter, divided into two sheets.
Figure 7B:
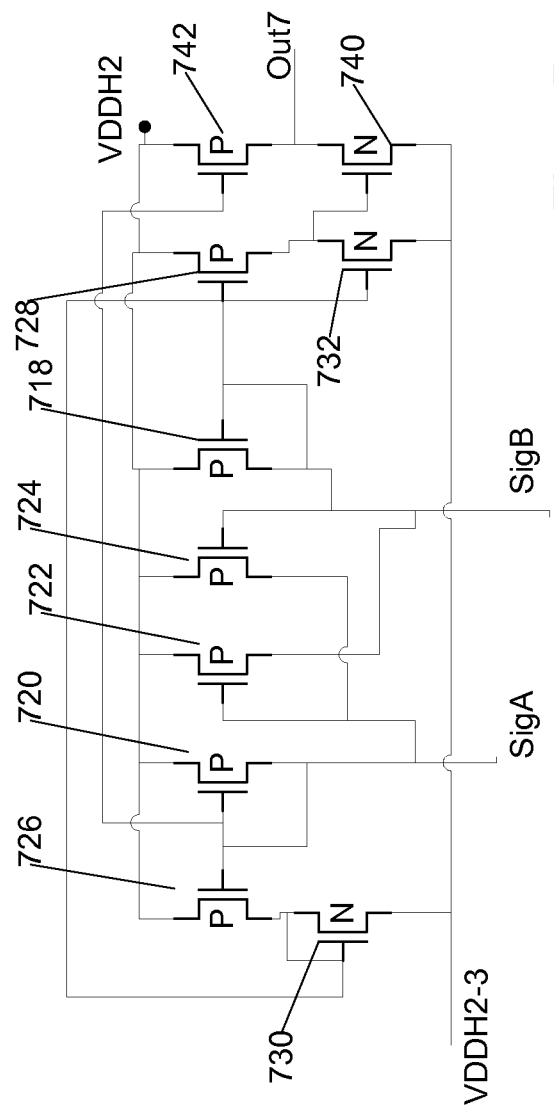

When producing a two-stage configuration, only a single glitch detector and two-level current source need be used, and it is not necessary to resolve sensed current to a single-ended, full-swing output between levels. In the two-stage embodiment of FIGS. 7A-7B, the first stage (FIG. 7A) resembles that previously describe with reference to FIG. 2, save for omission of mirror transistors 232, 230, 226, and output pulldown 240; differential first stage outputs are taken directly from mirror transistors 228, 242. The differential first stage outputs are then mirrored in pairs 702, 704 and 706, 708 of high-voltage transistors to provide a differential signal SigA, SigB to a second stage active load illustrated in FIG. 7B. In some embodiments, in order to achieve greater gain in the active loads, a third cross-coupled pair of high-voltage transistors 752, 750 is added to the mirror pairs.

In the active load, low voltage transistors 718, 720 provide an active load for differential signal SigA-SigB, cooperating with cross-coupled gain-enhancement devices 722, 724 to provide a significant differential signal that also appears at sense transistor pair 726, 728.

The differential signal at sense transistor pair 726, 728 is amplified by an output amplifier as follows: Typically, only one of sense transistor pair 726, 728 conducts at any given moment of time, if sense transistor 726 is conducting its current is mirrored in mirror transistors 730, 732. Pullup current from sense transistor 728 or pulldown current from mirror transistor 732 is combined to drive output buffer transistor 740 on when current flows in high voltage device 714. Similarly, when current flows in high voltage device 716, output buffer transistor 742 is turned on. Output buffer transistors 740, 742 cooperate to drive two stage shifter output Out7 to levels switching between VDDH2 and VDDH2 less a voltage, such as 2 volts to 5 volts, and in the illustrated embodiment 3 volts, suitable for use with low voltage transistors.

In a particular embodiment, VDDL is 3 volts, VDDH is about 20 volts, and VDDH2 is about 37 volts.

It should be noted that the present invention is also well suited for shifting signals from high voltage to low voltage, for example simple replacement of all P devices with N-channel devices, and N-channel devices with P-channel devices in the schematic diagrams illustrated would convert the design to shift signals at high voltages to low voltages.

Changes may be made in the above methods and systems without departing from the scope hereof. It should thus be noted that the matter contained in the above description or shown in the accompanying drawings should be interpreted as illustrative and not in a limiting sense. The following claims are intended to cover generic and specific features described herein, as well as all statements of the scope of the present methods and systems, which, as a matter of language, may be said to fall therebetween.

What is claimed is:

1. A digital level shifter adapted to shift an input signal from switching between a low voltage and the low voltage less a first offset voltage, to an output switching between a high voltage and a voltage equal to the high voltage less a second offset voltage, the high voltage being greater than the low voltage, comprising:
   a glitch generator configured to generate pulses at rising and falling transitions of the input signal;
   a multiple-level current source configured to provide a high current during the pulses from the glitch generator, and a low current at other times;
   a differential pair of high voltage transistors having sources coupled to the multiple-level current source, with a first transistor of the pair having a gate coupled to the input signal and a second transistor of the pair having a gate coupled to a complement of the input signal;
   an active load and buffer circuit, the active load powered by the high voltage and configured to drive the output to the high voltage when the input signal has a first value, and to drive the output to the voltage equal to the high voltage less the second offset when the input signal has a second value.

2. The digital level shifter of claim 1 wherein the active load comprises cross-coupled latch transistors configured to increase a gain of the active load.

3. The digital level shifter of claim 1 wherein drains of the high voltage transistors are coupled to the active load.

4. The digital level shifter of claim 1, further comprising a first and second current mirror of high voltage transistors coupled to mirror currents derived from drain currents of the differential pair by a second active load, outputs of the first and second current mirror of high voltage transistors being coupled to drive the active load.

5. A method of shifting an input signal from a low level to a high level comprising:
   providing a low level current to a differential pair of high voltage transistors, at least one transistor of the differential pair being coupled to the input signal;
   detecting changes of the input signal, and, upon detecting changes of the input signal, providing a high level current to the differential pair of high voltage transistors; and
   detecting a differential current from drains of the high voltage transistors, and deriving an output signal therefrom.

6. The method of claim 5, wherein the high level current is greater than 100 times the low level current.

7. A low-voltage to high-voltage level shifter comprising
   a current source coupled to provide current to a source of a first high voltage transistor, and to a source of a second high voltage transistor;
   a low voltage input signal coupled to a gate of the first high voltage transistor, and a complementary low voltage input signal coupled to a gate of the second high voltage transistor;
   the drain of the first high voltage transistor being coupled to a drain of a first cross-coupled low-voltage transistor, the drain of the second high voltage transistor being coupled to a drain of a second cross-coupled low-voltage transistor;
   wherein the gate of the first cross-coupled low-voltage transistor is coupled to the drain of the second high voltage transistor, and the gate of the second cross-coupled transistor is coupled to the drain of the first high voltage transistor;
   where the low and high voltage transistors are selected from the group consisting of N-channel and P-channel MOS transistors;
   wherein the current source is adapted to provide a first current to the sources of the high voltage transistors when the low voltage input signal is stable and to provide a second current greater than the first current when the low voltage input signal changes.

8. The level shifter of claim 7 further comprising an output buffer coupled to be driven to a first level when the drain of the first high voltage transistor carries greater current than the drain of the second high voltage transistor, and to a second level when the drain of the first high voltage transistor carries less current than the drain of the second high voltage transistor.

* * * * *